United States Patent
Kohli et al.

(10) Patent No.: US 9,324,414 B2
(45) Date of Patent: Apr. 26, 2016

(54) SELECTIVE DUAL CYCLE WRITE OPERATION FOR A SELF-TIMED MEMORY

(71) Applicant: STMicroelectronics International N.V., Amsterdam (NL)

(72) Inventors: Nishu Kohli, Noida (IN); Shishir Kumar, Greater Noida (IN)

(73) Assignee: STMICROELECTRONICS INTERNATIONAL N.V., Amsterdam (NL)

(*) Notice: Subject to any disclaimer, the term of this patent is extended or adjusted under 35 U.S.C. 154(b) by 351 days.

(21) Appl. No.: 13/949,449

(22) Filed: Jul. 24, 2013

(65) Prior Publication Data

US 2015/0029795 A1  Jan. 29, 2015

(51) Int. Cl.
*G11C 8/16* (2006.01)
*G11C 11/419* (2006.01)
*G11C 7/22* (2006.01)

(52) U.S. Cl.
CPC .............. *G11C 11/419* (2013.01); *G11C 7/227* (2013.01)

(58) Field of Classification Search
USPC .............. 365/189.14, 189.15, 189.16, 189.04
See application file for complete search history.

(56) References Cited

U.S. PATENT DOCUMENTS

| | | |
|---|---|---|
| 5,581,500 A | 12/1996 | D'Souza |
| 6,519,204 B2 | 2/2003 | Slamowitz et al. |
| 6,556,487 B1 | 4/2003 | Ratnakumar et al. |
| 8,345,469 B2 | 1/2013 | Pelley et al. |
| 2002/0149974 A1 | 10/2002 | Sato et al. |
| 2003/0002349 A1* | 1/2003 | Pilo et al. ................ 365/189.01 |
| 2004/0190326 A1* | 9/2004 | Shigenami et al. ........... 365/146 |
| 2004/0213046 A1* | 10/2004 | Yoshida ................... 365/185.14 |
| 2005/0213419 A1* | 9/2005 | Miyamoto ............... 365/230.03 |
| 2007/0279966 A1 | 12/2007 | Houston |
| 2008/0137440 A1 | 6/2008 | Liaw |
| 2012/0307574 A1 | 12/2012 | Cheng et al. |
| 2013/0308397 A1 | 11/2013 | Kohli |

* cited by examiner

*Primary Examiner* — Huan Hoang
*Assistant Examiner* — Minh Dinh
(74) *Attorney, Agent, or Firm* — Gardere Wynne Sewell LLP

(57) ABSTRACT

A write is performed to a first cell of a memory at a first row and column during a first memory access cycle. A memory access operation is made to a second cell at a second row and column during an immediately following second memory access cycle. If the memory access is a read from the second cell and the second row is the same as the first row, or if the memory access is a write to the second cell and the second row is the same as the first row and the second column is different than the first column, then a simultaneous operation is performed during the second memory access cycle. The simultaneous operation is an access of the second cell (for read or write) and a re-write of data from the first memory access cycle write operation back to the first cell.

24 Claims, 9 Drawing Sheets

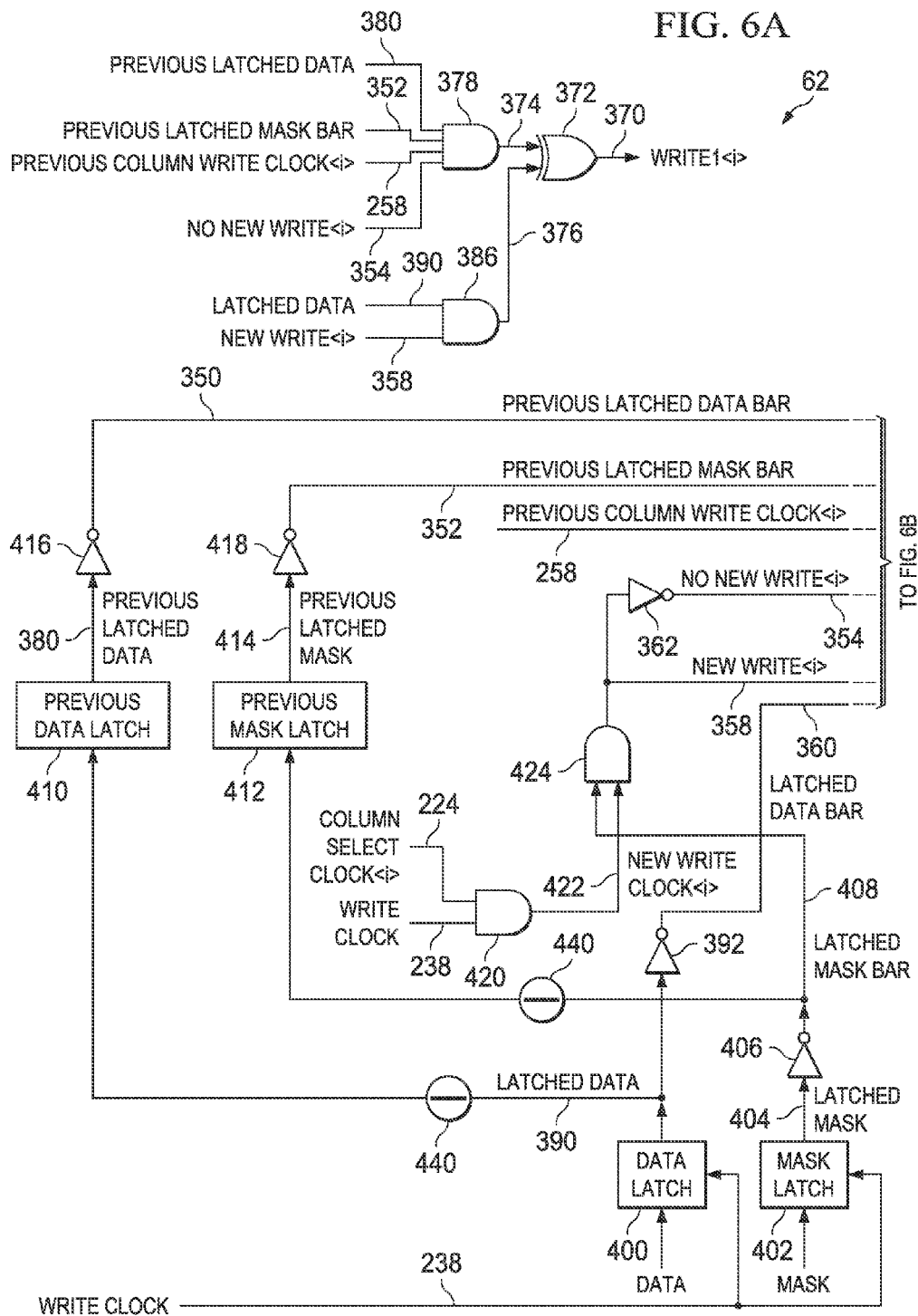

US 9,324,414 B2

SELECTIVE DUAL CYCLE WRITE OPERATION FOR A SELF-TIMED MEMORY

TECHNICAL FIELD

The present invention relates to integrated self-timed memory circuits and in particular to a self-timed static random access memory (SRAM) integrated circuit.

BACKGROUND

Reference is made to FIG. 1 which shows a schematic diagram of a standard six transistor (6T) static random access memory (SRAM) cell 10. The cell 10 includes two cross-coupled CMOS inverters 12 and 14, each inverter including a series-connected p-channel and n-channel transistor pair. The inputs and outputs of the inverters 12 and 14 are coupled to form a latch circuit having an internal true latch node 16 and an internal complement latch node 18. The cell 10 further includes two transfer (passgate) transistors 20 and 22 whose gate terminals are coupled to a wordline node and are controlled by the signal present on the wordline (WL). Transistor 20 is source-drain connected between the true latch node 16 and a node associated with a true bitline (BLT). Transistor 22 is source-drain connected between the complement latch node 18 and a node associated with a complement bitline (BLC). The source terminals of the p-channel transistors in each inverter 12 and 14 are coupled to receive a high supply voltage (for example, VDD) at a high voltage node $V_H$, while the source terminals of the n-channel transistors in each inverter 12 and 14 are coupled to receive a low supply voltage (for example, GND) at a low voltage node $V_L$. The high voltage VDD at the node $V_H$ and the low voltage GND at the node $V_L$ comprise the power supply set of voltages for the cell 10.

In an integrated circuit including the SRAM cell 10, this power supply set of voltages may be received at pins of the integrated circuit, or may instead be generated on chip by a voltage regulator circuit which receives some other set of voltages from the pins of the chip. The power supply set of voltages at the nodes $V_H$ and $V_L$ are conventionally applied to the SRAM cell 10 at all times that the cell/integrated circuit is operational. It will be recognized that separate low voltage values at node $V_L$ may be provided for the sources of the n-channel MOS transistors in the inverters 12 and 14 while separate high voltage values at node $V_H$ may be provided for the sources of the p-channel MOS transistors in the inverters 12 and 14.

The reference above to a six transistor SRAM cell 10 of FIG. 1 for use as the data storage element is made by way of example only, it being understood to those skilled in the art that the cell 10 could alternatively comprise a different data storage element. The use of the term SRAM cell 10 will accordingly be understood to refer any suitable memory cell or date storage element, with the circuitry, functionality and operations presented herein in the exemplary context of a six transistor SRAM cell.

Reference is now made to FIG. 2 which shows a block diagram of a self-timed memory 30, for example of the static random access memory (SRAM) type using memory cells 10 shown in FIG. 1, with "w" words and "b" bits organized as a column mux of "m". Those skilled in the art understand that self-timed memories need to support a high dynamic operating voltage range. In other words, these memories need to be functional over a wide range of supply voltages, starting from a very high operating voltage and down to a very low operating voltage. In most cases, in the low operating voltage range, it is considered acceptable if the memory achieves a lower performance (i.e., it is slower). In nominal operating voltage range, the memory needs to support a higher performance (i.e., it needs to be faster).

The memory 30 includes a first section 32 comprising a plurality of memory cells 10 arranged in a matrix/array format and which function to store data. The first section 32 includes "b" sub-sections 34 corresponding to the "b" bits per word stored by the memory. The first section 32 is arranged to store "w" words and is organized as a column mux of "m". Thus, each of the "b" sub-sections 34 is organized in "w/m" rows with "m" columns in each row. In the first section 32, all cells 10 in a same row share a common wordline (WL) coupled to an output of a row decoder circuit 60 (well known to those skilled in the art), and all cells 10 in a same column share a common true bitline (BLT) and a common complement bitline (BLC) coupled to column circuitry 62 (which includes bitline precharge and equalization circuitry, column mux circuitry, write driver circuitry, column address decoder circuitry and input/output circuitry, each of which is well known to those skilled in the art).

Before beginning a write operation, the wordlines are driven low by the row decoder circuitry 60, and the true bitlines and complement bitlines are driven high. To write data to the first section 32, the wordline of the row selected according to the row address is driven high by the row decoder circuitry 60 and a column is selected in each sub-section 34 by the column address decoder and column mux in the column circuitry 62 based on the column address to connect the selected column's true bitline and complement bitline to the input/output circuitry (which, for example, will typically utilize bitline write drivers) At this point both the true bitline and complement bitline of the selected column in each sub-section 34 are made floating by the precharge and equalization logic in the column circuitry 62. In dependence on the bits of the dataword being written, one of the true bitline and complement bitline in the selected columns of each sub-section 34 are driven low by the bitline write driver circuitry. The bitline voltages are transferred to the corresponding internal true latch node 16 and complement latch node 18 of the memory cell 10 in the selected row and column in the sub-section 34 so as to write and store the proper data state.

The memory 30 includes a second section 46 including plurality of memory cells 10 arranged in a matrix format, but these cells do not function to store data. Indeed, these cells are only required, if desired, in order to have a regular layout of the memory array. The wordline ports of the memory cells 10 in the rows of this section are connected to the ground reference voltage (GND).

The memory 30 includes a third section 36 including a plurality of memory cells 10 arranged in a matrix format, and these cells also do not function to store data. Rather, these cells in the third section 36 are used to emulate the same load on a reference wordline (REFWL), which is coupled to a reference row decoder 64, as is present on the actual wordlines (WL) of the first section 32. In other words, the purpose of section 36 is to emulate a total load of "b*m" columns of memory cells 10 on the reference wordline REFWL.

The section 36 includes "b" sub-sections 38. Each sub-section 38 includes two rows of "m" memory cells 10. All memory cells 10 within the third section 36 either have their true bitlines and complement bitlines connected to a power supply voltage (for example, at node $V_H$) or have them floating. The wordline ports of the memory cells 10 within one of the two rows of the first half of the total "b" sub-sections 38 (i.e., of the first "b/2" sub-sections 38) are coupled to the reference wordline signal generated by the reference row decoder circuit 64 (the reference wordline arriving in section 36 after having passed through the second section 46). This is done to emulate the same propagation delay corresponding to "b*m/2" columns on REFWL as is present on all the WL signals in propagating from row decoder 60 to the middle of section 32. Further, the REFWL signal which has thus reached at or about the center of the section 36 is twisted back and returned towards reference row decoder circuit 64. This returning REFWL signal is connected to the other of the two rows of the first half of the total "b" sub-sections 38 (i.e., of the first "b/2" sub-sections 38), eventually reaching the second section 46 (for connection to the wordline ports of the cells 10 therein) after experiencing a propagation delay corresponding to travelling across "b*m" columns —same as that experienced by the signal WL in propagating from row decoder 60 to the column farthest from the row decoder 60 at the end of section 32 in one row of memory cells. The reference wordline of the memory cells 10 in both rows within other "b/2" sub-sections 38 is coupled to a ground supply voltage (at the node $V_L$) because these sub-sections 38 are present in the memory only for maintaining regularity and rectangular shape of the array of the memory cells 10, and so the memory cells 10 in these sub-sections 38 are deactivated permanently by connecting their wordline ports to a ground supply voltage (for example, at the node $V_L$).

The memory 30 further includes a fourth section 40 including a plurality of write timer cells 42 and load cells 44 arranged in a matrix format: "w/m" rows and one column. The write timer cells 42 and load cells 44 each have a configuration similar to a memory cell 10 (like the SRAM cell shown in FIG. 1). The REFWL signal further propagates into fourth section 40 for connection to the wordline ports of the included timer cells 42 and load cells 44.

The timer cells 42 are essentially memory cell like elements that are built from the same devices as used by the memory cells 10 in section 32 (for example, also SRAM type cells). These timer cells 42 operate to write a selected logic value data state (for example, logic low) from the reference true bitline (REFBLT) into the internal true node "REFIT" in response to arrival of the reference wordline (REFWL) signal to the wordline ports. The data write time for this operation to be completed is indicative of the time required to write data from an actual bitline in the memory cell 10 of section 32 to the internal true latch node 16 (also referred to as the REFIT node). The change in logic state at the internal complement latch node 18 (also referred to as the REFIC node) or reference complement bitline (REFBLC) coupled thereto may be sensed to detect an end of a write cycle for the memory.

The load cells 44 are elements similar to write timer cells 42, with the difference that their reference wordline (REFWL) ports are grounded, so that they serve to match the load of actual bitlines (BLT/BLC) on REFBLT and REFBLC.

The wordlines WL generated in the row decoder circuitry 60 simply pass through this section 40 in order to reach the first section 32.

There are a total of "w/m" write timer cells 42 and load cells 44, in order to emulate same load on the reference true and complement bitlines within section 40 as is present on the true and complement bitlines within first section 32. A certain number of these "w/m" cells are timer cells 42, and the remaining are load cells 44. The internal latch nodes REFIT and REFIC of the timer cells 42 are respectively connected together in order to improve their load driving capability as well as reduce the statistical variability of write time of the internal nodes REFIT and REFIC, in turn reducing the statistical variability of the write cycle time. Thus, the write timer cells 42 are designed to store data in the latch circuitry (i.e., write a logic "0" on the true latch node 16 REFIT followed by a rising to logic "1" on the complement latch node 18 REFIC) with a write time which is substantially the same as that required for the latch circuitry of a selected actual memory cell 10 to have data written in the true and complement nodes during a write operation. The write time (i.e., rate of data storage) of the timer cells 42 is desired to be about the same as the write time of the actual internal latch nodes of the memory cells 10 so that the complement latch node (REFIC) is able to rise to a logic high level detectable by a detector circuit (such as an inverter circuit) contained within the column circuitry 62 in the same time in which a memory cell 10 with a statistically worst write time is able to have actual data written into it and its latch circuit set accordingly. Multiple write timer cells 42 with their internal latch nodes REFIT and REFIC shorted together help in improving the load driving capability of the internal nodes and reducing statistical variability of the rise time of REFIC and in turn the cycle time of the write operation (as explained above). This detection of REFIC state change is propagated by subsequent logic to generate an end of write cycle reset "WRITERST" signal which triggers in the control circuit the beginning of various internal reset events of the memory such as wordline off, bitline precharge on and write driver off to prepare the memory to receive the next command. Thus, the intention of this operation is to time the start of write cycle reset events inside the memory at an optimum time permitting a certain memory cell 10 with a statistically worst write time in section 32 to be successfully written with data corresponding to its data bit (I/O) in any write cycle.

A more detailed description of memory operation is now provided. Before any write cycle begins, all memory bitlines and the reference bitlines are precharged to logic high (VDD), all memory wordlines (WL) and the reference wordline (REFWL) are driven to logic low (GND) and the timer cells 42 are initialized in the state with REFIT storing logic "1" and REFIC storing logic "0". At the start of a valid write operation characterized by the "clock" edge when the "chip select" signal is asserted for enabling the memory and the "write enable" signal is asserted for the write operation, a clock generator triggers the internal clock signal at the arrival of the "clock" edge (either rising or falling edge depending on the functionality of the memory). The internal clock signal triggers the following operations (more or less concurrently): a) drive a selected one of the "w/m" wordlines WL (depending on row address) to logic high; b) drive the reference wordline (REFWL) to logic high; c) turn off precharge of the reference bit lines (REFBLT, REFBLC), and turn off precharge of the bit lines (BLT, BLC) of a selected one of the "m" columns in each of "b" bits (depending on column address); d) trigger the write driver circuitry in the column circuitry 62 in each of the "b" bits to drive one of the "m" bit line pairs of the first section 32 in each bit (I/O) (depending on column address) with either logic "1-0" or logic "0-1" based on data to be written onto corresponding bit (as indicated by the input/output circuitry); and e) trigger the reference write driver circuitry of the column circuitry 62 to drive a logic "0" onto the reference bit line true REFBLT node which will eventually lead to a flip of the original data maintained at the internal true and complement nodes (REFIT, REFIC) in the write timer cells 42 (i.e., the logic "1" on REFIT would be flipped to logic "0" and the logic "0" on REFIC would be flipped to logic "1").

The above operations in turn start the following operations (performed more or less concurrently): a) the rising of the selected wordline and the driving of logic "0-1" or logic "1-0" on to the bit line (BLT, BLC) pairs of the selected column of any bit (I/O) begins the write operation on the memory cell in selected row and selected column for each bit (in the first section 32); and b) the rising of reference wordline (REFWL) and driving of a logic "0" onto the true reference bit line "REFBLT" begins a reference write operation on the multiple write timer cells 42 of the third section 40, causing the internal true node "REFIT" to fall to logic "0" and the internal complement node "REFIC" to start rising towards logic "1".

It will be noted that there is only a single memory cell 10 in each bit (I/O) which is being written by the true and complement bit lines (BLT, BLC), but there are multiple write timer cells 42 in parallel in a column that are being written with an opposite data by the reference true and complement bit lines (REFBLT, REFBLC). Thus, the time period required for the parallel connected latches of the timer cells 42 to change state is expected to be the same as the time required for the latch of a nominal memory cell 10 in any bit (I/O) to change state, because the multiple number of timer cells 42 acting on the internal nodes REFIT and REFIC would reduce the statistical variability of the time taken by the timer cells 42 to change state resulting in a time almost equal to that taken by a nominal memory cell 10. Thus, it will be accurate to say that the time it takes for data to be completely written onto any memory cell 10 of the section 32 is statistically much more variable than what it takes to write data onto the write timer cells 42 connected in parallel in the section 40.

In the memory of FIG. 2, both the wordline WL and reference wordline REFWL are driven by similarly sized drivers, to a full logic high, while the bit lines (either BLT or BLC depending on data to be written in any bit (I/O)) as well as the true reference bit line REFBLT are driven to full logic low, by similarly sized bitline write drivers of similar fanout. The change in logic state at the internal latch node REFIC of the write timer cells 42 generates an end of write cycle reset WRITERST signal. The generated WRITERST signal activates the control circuitry of the memory to trigger the beginning of various internal reset events of the memory such as wordline off, bitline precharge on and write driver off to prepare the memory to receive the next command. By this time, the write data of any bit (I/O) is latched by the selected memory cells 10 for the respective bits (I/Os), thus completing the write operation.

It is desirable to have the write timer cells 42 designed and their number chosen such that, in about the same time that a memory cell 10 with a statistically worst write time takes to latch data corresponding to the true and complement bitlines (BLT, BLC), on any process (P), voltage (V) and temperature (T) condition, the multiple timer cells 42 are able to latch data with the reference internal latch node REFIC rising to a level detectable by a simple detector circuit (such as an inverter) in the column circuitry 62. That way, the rising of the REFIC node can be detected by the column circuitry 62 to generate the end of write cycle reset WRITERST signal at an optimum time for performing the write operation successfully and with best (i.e., least) write cycle time. The WRITERST signal turns off the wordline WL, reference wordline REFWL, write drivers and reference write driver (in the column circuitry 62), precharges the bit lines BLT/BLC and reference bit lines REFBLT/REFBLC, and resets the write timer cells 42 and internal clock generator. A new write operation may then be initiated at the end of this write cycle.

It is accordingly important to ensure that the entire delay generated by the write self-timing logic described is tuned in order to guarantee a successful write operation.

Reference is now made to FIG. 3 which presents a timing diagram illustrating one cycle of the write operation. From FIG. 3, it can be observed that in order to design a robust memory (i.e., a memory that yields well under corner case conditions also), it is important to tune the delay period "TREFWRITE" (measuring the delay from initiation of the reference write operation to completion of state change for the reference internal node REFIC) in such a way that a write to a memory cell with a statistically worst write time equal to "TWRITE" (measuring the delay from initiation of the array write operation after delay t1 to completion of state change for the internal nodes 16 and 18) is able to be completed before the signal WRITERST is generated (and the wordline and bit lines are reset). The delay "TREFWRITE_WRRST" measures the delay between completion of state change for the reference internal node REFIC and the active state of the WRITERST signal. Thus, if "TWRITE" is the write time of a memory cell with a statistically worst write time (indicated by completion of change in the internal true and complement latch nodes 16 and 18), and if "TREFWRITE" is the write time of the "n" write timer cells 42 connected in parallel and included within the section 40, it would be ideal to have "TWRITE" and "TREFWRITE" have substantially the same value across different process (P), voltage (V) and temperature (T) conditions. The value of "TREFWRITE" should preferably be such that for any P, V and T condition, the time it takes for the write timer cell 42 to flip causing the internal complement node REFIC to rise beyond a level which is detected by a detector circuit (such as a simple inverter) to generate WRITERST signal and further terminate the write operation, is always longer than, but as close as possible to, the time TWRITE required for the completion of a write to a worst memory cell 10 with a statistically worst write time.

Reference is now made to FIG. 4 which illustrates the phases of the write operation presented in connection with the writing of a logic low to the internal true latch (REFIT) node 16 and a logic high to the internal complement latch (REFIC) node 18. The issue is how long the write cycle needs to last in order to ensure proper data retention in the latch of the memory cell.

The first phase of operation 100, referred to as the retention risk phase, starts when the internal true node 16 starts to fall and the internal complement node 18 starts to rise. The write cycle must last longer than the first phase, because the wordline WL cannot be turned off and the bitlines cannot be precharged during this first phase time period without risking leading the internal true node 16 back to logic high and the internal complement node 18 back to logic low.

The second phase of operation 102, referred to as the write consolidation phase, occurs as the internal true node 16 has fallen almost completely to logic low and the internal complement node 18 continues to rise. Again, the write cycle must last longer than the second phase, because the wordline WL cannot be turned off and the bitlines cannot be precharged during this second phase time period because doing so will cause a delay in the process of the internal complement node 18 rising since the complement bitline (BLC) is still supporting the operation for the internal complement node 18 to rise through the connected passgate transistor.

The third phase of operation 104, referred to as the read stability risk phase, occurs as the internal complement node 18 continues to rise. At this point, the wordline WL may be turned off and bitline precharge may be turned on because the passgate connected to the complement bitline (BLC) is no longer needed to support rise of the internal complement node 18. However, the write cycle must still last longer than the third phase time period, because the same wordline cannot be turned on again for a read operation on any column of that row since the internal complement node 18 has not risen to a high enough level so as to ensure sufficient drive in the pull down device of the latch. There is accordingly a stability issue.

The fourth phase of operation 106, referred to as the next read operation risk, occurs as the internal complement node 18 continues to rise. At this point a next read operation may be performed on any column in the row, except for the column on which the write operation was performed. Thus, for operations on other columns in the row on which the write operation was performed, the write cycle is complete, but for operations on the same columns in that row, the write cycle is not complete. The reason for this is because the internal complement node 18 is continuing to rise, and thus the gate connected pull down device of the latch is still weak. This leads to read current degradation on the associated column of cells requiring that the write cycle not be complete until the end of the fourth phase time period.

With respect to the phases of operation illustrated in FIG. 4, those skilled in the art will recognize that write cycle time for the memory is dictated by the rise time of the node on which a logic high value is being written. There is a need in the art to improve that write cycle time and especially address the next read operation risk.

One solution known in the prior art to improve rise time of the node on which a logic high value is being written uses circuitry to pull the corresponding bitline (the complement bitline (BLC) in the example above) to a negative voltage level instead of to logic low. The effect of the negative voltage applied to the bitline is to increase the gate drive of the passgate transistor on the true side of the latch which will lead to a corresponding faster rise in the internal latch node (internal true node 16 in the example above).

This solution has drawbacks. The solution requires the extra circuit overhead of a negative power supply and circuits to support selective application to the proper bit line during write mode. If the solution is implemented internally using a capacitance, there is a limited performance gain because to the two-step process needed to generate a negative voltage. Additionally, there is a device reliability concern with respect to this solution at higher supply voltages because of the resulting overdrive on some transistors.

Another solution is to overdrive the wordline to a voltage higher than $V_H$. This results in the bitline supporting a rise on the internal node through the passgate transistor to a higher voltage value than earlier.

This solution has drawbacks. The solution requires the extra circuit overhead of an overdrive voltage supply (either externally or internally generated using capacitance). There is also a concern that this will introduce an instability on unselected columns whose cells also receive the overdriven wordline voltage. Additionally, there is a device reliability concern with respect to this solution at higher supply voltages due to the application of the overdrive voltage on some transistors within the circuit.

Another solution implements a modification to the cell 10 to include additional pullup devices for the latch circuitry. These additional pullup devices provide additional drive support during the write operation to pull the internal latch node towards logic high. These extra devices are actuated only for the selected row and selected columns of the memory which are subject to the write.

The solution has drawbacks. There is only a limited improvement in performance because of extra load being applied on the wordlines and bitlines by the additional pullup devices. Also, these devices contribute to an increase in capacitance on the internal latch nodes. Additionally, the use of additional pullup devices is made at the expense additional area overhead for the cell 10, and this can be a significant concern in medium to high capacity memory array configurations.

With reference once again to FIG. 4 and in particular to the fourth phase of operation 106 (next read operation risk), this waiting time after wordline turn off is required to ensure there is no degradation with respect to read current. However, this waiting time presents a significant portion of the overall write cycle time and if this time could be reduced or eliminated there would be a significant improvement in write cycle time.

To address this issue, one proposed solution is to store the data being written to the memory in a parallel manner during the write cycle in a separate storage element distinct from the addressed cell (perhaps provided within the memory input/output circuit of the column circuitry as shown in FIG. 2). This parallel write is made using a current write cycle, and the write cycle time may be said to terminate at the end of the third phase of operation 104 (the read stability risk phase).

In order to alleviate the risks associated with lower read current, an address comparison is performed during the next read cycle which immediately follows the previous write cycle. If there is a match in the asserted write and read addresses, the read operation is made from the data separate storage element of the input/output circuit (instead of from the memory array itself). Because the read is being made to the separate storage element of the input/output circuit, the reduction in read current within the addressed memory cells is immaterial. Thus, in such a case, the subsequent read may be made immediately after the completion of the third phase of operation 104 (the read stability risk phase). In all other memory access scenarios, the fourth phase of operation 106 (next read operation risk) is permitted to complete before a next read occurs.

The solution has drawbacks, and in particular is subject to a flaw which results in failure. If the wordline is turned on before the end of the fourth phase of operation 106 (the next read operation risk), with both bitlines at the high logic level (as would happen in case of a read operation on the same row right after the write operation), then no further rise in the internal latch node will occur because of the weakening of the connected pullup transistor. This is a result of a bounce created on the logically opposite internal latch node.

It is accordingly insufficient for guaranteed operation to merely compare the address for the current read cycle to the address for the immediately preceding write cycle. Rather, the comparison is logically more complex in that it should test not only for an address match for a write operation in the immediately preceding cycle, but also for an address match with a previous write operation that was performed any number of cycles before the current cycle but the fourth phase of operation 106 (next read operation risk) was not available.

This solution accordingly presents an additional drawback in that the required logic for testing the multiple comparisons is complex (for example, using a complex state machine) to take care of the situation in which, after a write operation on any row and column, multiple consecutive operations are performed on different columns of the same row prior to a read operation on the same row and same column.

A need accordingly exists in the art to address the foregoing and other problems associated with shortening the write cycle time of a self-timed static random access memory (SRAM) integrated circuit.

SUMMARY

In an embodiment, a method comprises: performing a write operation to a first cell of a memory array at a first row and first column location during a first memory access cycle; and performing a memory access operation to a second cell of the memory array at a second row and second column location during a second memory access cycle, said second memory access cycle immediately following the first memory access cycle. The performing of the second memory access cycle operation comprises: determining if the second row is a same row as the first row; determining if the second column is a different column than the first column; and if the second row is the same row as the first row and the memory access operation is a read, or if the second row is the same row as the first row, the second column is the different column than the first column and the memory access operation is a write, then: simultaneously within said second memory access cycle accessing the second cell and re-writing data from the first memory access cycle write operation to the first cell.

A circuit comprises: a memory array including a plurality of memory cells arranged in rows and columns; and a control circuit configured to control read and write access to the memory array. The control circuit is operable to: determine whether a write operation during a first memory access cycle to a first cell and a memory access operation during a second memory access cycle to a second cell share access to a same row and different column of the memory array, said second memory access cycle immediately following the first memory access cycle; and if there is a same row and the memory access operation is a read, or if there is a same row and different column and the memory access operation is a write, then: simultaneously within said second memory access cycle access the second cell and re-write data from the first memory access cycle write operation to the first cell.

In an embodiment, a method comprises: performing a first write operation to a first cell of a memory array at a first row and first column location during a first memory access cycle; and performing a second write operation to a second cell of the memory array at a second row and second column location during a second memory access cycle, said second memory access cycle immediately following the first memory access cycle. The performing of the second memory access cycle operation comprises: determining if the second row is a same row as the first row; determining if the second column is a different column than the first column; and if both determinations are positive, then: simultaneously within said second memory access cycle writing to the second cell and re-writing data from the first memory access cycle first write operation to the first cell.

A circuit comprises: a memory array including a plurality of memory cells arranged in rows and columns; and a control circuit configured to control read and write access to the memory array. The control circuit is operable to: determine whether a first write operation during a first memory access cycle to a first cell and a second write operation during a second memory access cycle to a second cell share access to a same row and different column of the memory array, said second memory access cycle immediately following the first memory access cycle; and if there is a same row and different column, then: simultaneously within said second memory access cycle perform the write access operation on the second cell and perform a re-write of the data from the first memory access cycle write operation to the first cell.

In an embodiment, a method comprises: performing a write operation to a first cell of a memory array at a first row and first column location during a first memory access cycle; and performing a read operation from a second cell of the memory array at a second row and second column location during a second memory access cycle, said second memory access cycle immediately following the first memory access cycle. The performing of the second memory access cycle operation comprises: determining if the second row is a same row as the first row; and if said determination is positive, then: simultaneously within said second memory access cycle reading from the second cell and re-writing data from the first memory access cycle write operation to the first cell.

A circuit comprises: a memory array including a plurality of memory cells arranged in rows and columns; and a control circuit configured to control read and write access to the memory array. The control circuit is operable to: determine whether a write operation during a first memory access cycle to a first cell and a read access operation during a second memory access cycle to a second cell share access to a same row of the memory array, said second memory access cycle immediately following the first memory access cycle; and if there is a same row access operation is a read, then: simultaneously within said second memory access cycle perform the read access operation on the second cell and perform a re-write of the data from the first memory access cycle write operation to the first cell.

BRIEF DESCRIPTION OF THE DRAWINGS

For a better understanding of the embodiments, reference will now be made by way of example only to the accompanying figures in which:

FIGS. 5, 6A-6B and 7-9 show control circuitry for use in connection with the memory of FIG. 2.

DETAILED DESCRIPTION OF THE DRAWINGS

Figure 3:
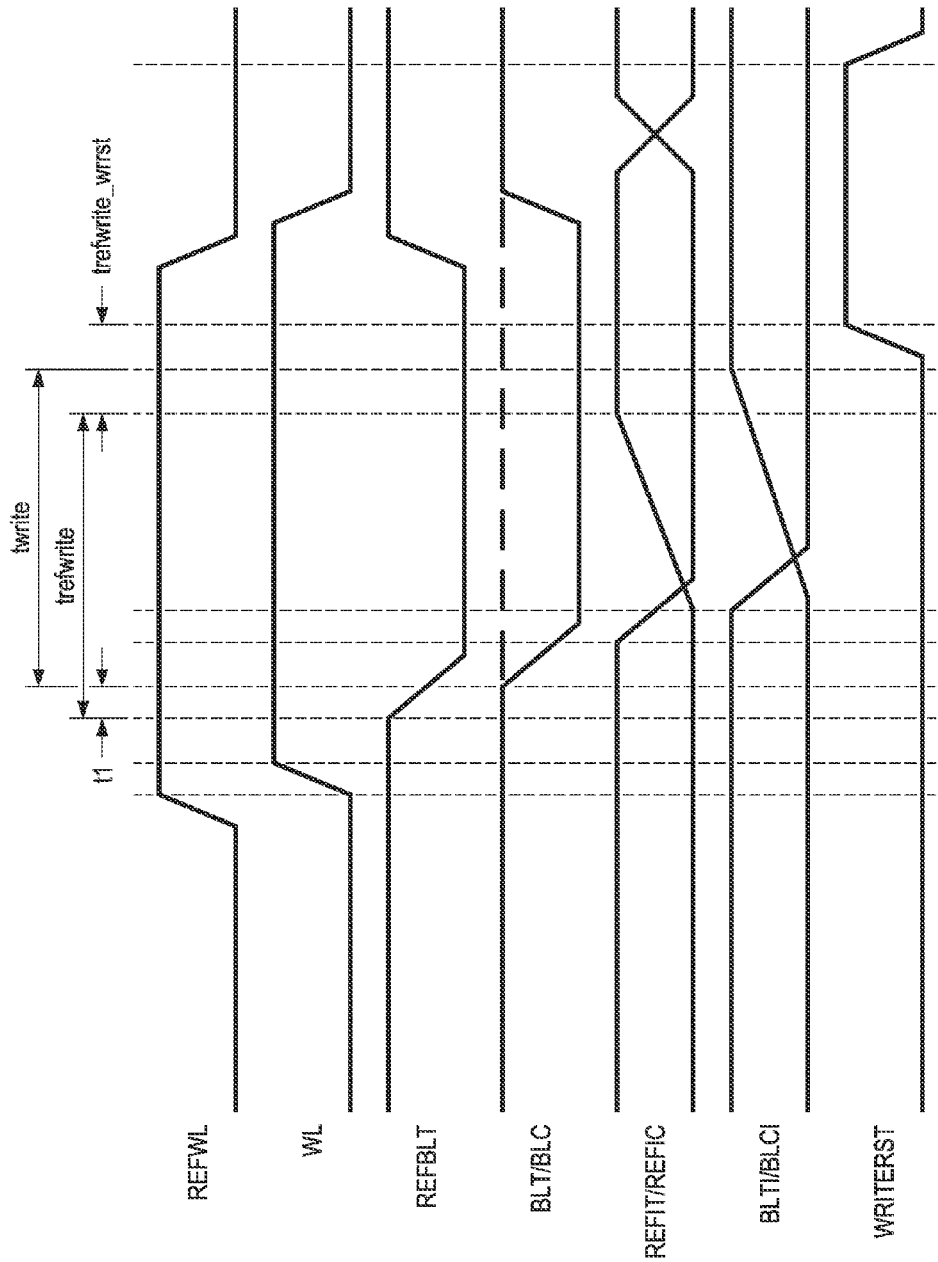
FIG. 3 shows a timing diagram concerning operation of the memory of FIG. 2.
Figure 4:
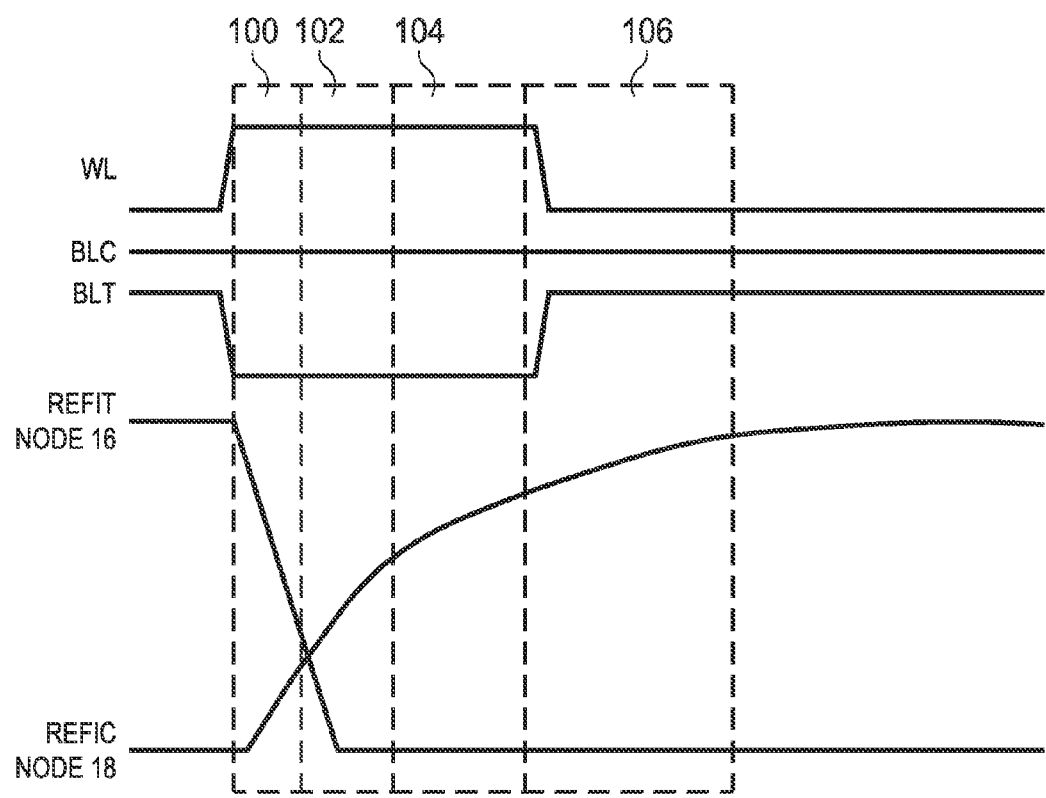
FIG. 4 illustrates the phases of the write operation associated with the write cycle time of the memory of FIG. 2.

Reference is once again made to FIG. 3 and the solution to store the data being written to the memory in a parallel manner in a separate storage element (perhaps provided with the memory input/output circuit of the column circuitry). It will be noted that the identified flaw arises only in the situation where the same wordline is activated for the subsequent cycle and both bitlines of the column on which the write operation was performed in the immediately preceding cycle are at logic high values for the current cycle. The solution presented herein is designed to remove this condition for failure. So, in the case of a write operation followed by any other operation on the same addressed row, the solution will take the data written to the memory in the immediately preceding write cycle and write that same data again into the memory in the current cycle while the current operation is being simultaneously performed (i.e., the current operation and the re-write operation are performed in parallel during the current cycle).

The solution accordingly affects the condition for assertion of the wordline "on" with both bitlines at logic high values for the memory cell written to in a previous cycle to instead present a condition for assertion of the wordline "on" with either of the bitlines at a logic high value and the other bitline at logic low value for the memory cell written to in a previous cycle. This will essentially write back the same data which was written in previous write cycle into the memory cell. This will provide a memory cell operable in the absence of the fourth phase of operation 106 (next read operation risk) to provide for a shorter write cycle time even in situations of consecutive access on the same wordline.

In order to implement this solution, a flag referred to as a "Previous Write" flag is defined in the control circuit logic and evaluated in connection with next cycle operations. The logic for generating the Previous Write flag applies to set the flag at the end of every write cycle and reset the flag at the end of every read cycle. Additionally, in each IO, the latched data and mask information corresponding to a write cycle is maintained over the next cycle as well on "Previous Latched Data" and "Previous Latched Mask" signals.

In order to appreciate the difference in memory operation contemplated by the preferred process, a number of operational cases are considered in connection with a comparison between the prior art process and the preferred process:

CASE 1: In a first cycle, a write cycle, such as a data write or a masked data write, is performed on a cell at a first column <i1> and row <r1> location and the Previous Write flag is set at the end of the first (write) cycle. In a second (next) cycle, a data read or data write is made on a cell at a second column <i2> and row <r2> location, wherein the second row <r2> is different from the first row <r1>. There is no change with respect to prior art processing for this case. The second (next) cycle proceeds with a data read or data write to the cell at the second column <i2> and row <r2> location, and no operation is performed with respect to the cell at the first column <i1> and row <r1> location written to during the first cycle. If the second (next) cycle is a data read, the Previous Write flag is cleared. If the second (next) cycle is a data write, the Previous Write flag is set at the end of the second (next) cycle.

CASE 2: In a first cycle, a data read is made from a cell at a first column <i1> and row <r1> location and the Previous Write flag is cleared at the end of the first (read) cycle. In a second (next) cycle, a data read or data write is made on a cell at any location. The second (next) cycle proceeds with a data read or data write, and no operation is performed with respect to the cell at the first column <i1> and row <r 1> location read from during the first cycle. If the second (next) cycle is a data read, the Previous Write flag is cleared. If the second (next) cycle is a data write, the Previous Write flag is set.

CASE 3: In a first cycle, a write cycle, such as a data write or a masked data write, is performed on a cell at a first column <i1> and row <r1> location and the Previous Write flag is set at the end of the first (write) cycle. In a second (next) cycle, a data read is made on a cell at a second column <i2> and the first row <r1> location, wherein the second column <i2> is different from the first column <i1>. Here there is a change with respect to prior art processing for this case. The previous write to the cell at the first column <i1> and row <r1> is detected from the set Previous Write flag, and a parallel read and write operation is performed during the second (next) cycle wherein: a) data is read from the cell at the second column <i2> and the first row <r1> location, and simultaneously b) the previously written data from the first cycle is written back into (i.e., written again) the cell at first column <i1> and row <r1> location by utilizing the information present on the signals "Previous Write Latched Data" and "Previous Latched Mask" referred to earlier. The Previous Write flag is cleared at the end of the data read operation.

CASE 4: In a first cycle, a masked data write is made on a cell at a first column <i1> and row <r1> location and the Previous Write flag is set at the beginning of the first (write) cycle. In a second (next) cycle, a data read is made on a cell at a second column <i2> and the first row <r1> location, wherein the second column <i2> is different from the first column <i1>. There is no change with respect to prior art processing for this case. The previous write to the first column <i1> and row <r1> is detected from the set Previous Write flag. However, in this case only a data read is performed during the second (next) cycle because the first (write) cycle masked write operation is equivalent to a no-write operation. The no-write operation on the location defined by column <i1> and row <r2> is realized by using the "Previous Latched Data" and "Previous Latched Mask" information in each IO. The Previous Write flag is cleared at the end of the data read operation.

CASE 5: In a first cycle, a data write is made on a cell at a first column <i1> and row <r1> location and the Previous Write flag is set at the end of the first (write) cycle. In a second (next) cycle, a data read is made on the same cell at the first column <i1> and the first row <r1> location. Here there is a change with respect to the prior art processing for this case. The previous write to the cell at the first column <i1> and row <r1> is detected from the set Previous Write flag, and a parallel read and write operation is performed during the second (next) cycle wherein: a) data is read from the cell at the first column <i1> and the first row <r1> location (previously written to in the first cycle), and simultaneously b) the previously written data is written back into (i.e., written again) the cell at the first column <i1> and row <r1> location by utilizing the information present on the signals "Previous Write Latched Data" and "Previous Latched Mask" referred to earlier. As the bitlines get driven by the write driver as well as the memory cell at location row <r1> and column <i1>, the risk of incorrect read because of lesser read current as explained in the prior art is mitigated. The Previous Write flag is cleared at the end of the data read operation.

CASE 6: In a first cycle, a masked data write is made on a cell at a first column <i1> and row <r1> location and the Previous Write flag is set at the end of the first (write) cycle. In a second (next) cycle, a data read is made on the same cell at the first column <i1> and the first row <r1> location. There is no change with respect to prior art processing for this case. The previous write to the cell at the first column <i1> and row <r1> is detected from the set Previous Write flag, but it is noted that the previous write was a masked write which is equivalent to a no write operation. Thus, only a data read from the cell at the first column <i1> and the first row <r1> location is performed during the second (next) cycle. The Previous Write flag is cleared at the end of the data read operation.

CASE 7: In a first cycle, a write cycle, such as a data write or a masked data write on a cell at a first column <i1> and row <r1> location, is performed and the Previous Write flag is set at the end of the first (write) cycle. In a second (next) cycle, another write cycle, such as a data write or a masked data write on a cell at a second column <i2> and the first row <r1> location, wherein the second column <i2> is different from the first column <i1>, is performed. Here there is a change with respect to the prior art processing for this case. The previous write to the cell at the first column <i1> and row <r1> is detected from the set Previous Write flag, and a parallel write operation is performed during the second cycle wherein: a) data is written into the cell at the second column <i2> and the first row <r1> location and simultaneously b) the previously written data is written back into (i.e., written again) the cell at the first column <i1> and row <r1> location by utilizing the information present on the signals "Previous Write Latched Data" and "Previous Latched Mask" referred to earlier. The Previous Write flag is set at the end of the second (write) cycle.

CASE 8: In a first cycle, a write cycle, such as a data write or a masked data write, is performed on a cell at a first column <i1> and row <r1> location and the Previous Write flag is set at the end of the first (write) cycle. In a second (next) cycle, another write cycle, such as a data write, is performed on the same cell at the first column <i1> and the first row <r1> location. There is no change with respect to prior art processing for this case. The previous write to the cell at the first column <i1> and row <r1> is detected from the set Previous Write flag. However, since the memory location is the same for both the first cycle write and the second cycle write, the new data is written into the cell at the first column <i1> and the first row <r1> location during the second (write) cycle (i.e., the new data to be written controls the write driver rather than the "Previous Latched Data" and "Previous Latched Mask"). The Previous Write flag is set at the end of the second (write) cycle.

CASE 9: In a first cycle, a write cycle, such as a data write or a masked data write, is performed on a cell at a first column <i1> and row <r1> location and the Previous Write flag is set at the end of the first (write) cycle. In a second (next) cycle, another write cycle, but a masked write, is performed on the same cell at the first column <i1> and the first row <r1> location. Here there is a change with respect to the prior art processing for this case. The previous write to the cell at the first column <i1> and row <r1> is detected from the set Previous Write flag, and during the second cycle the previously written data is written back into (i.e., written again) the cell at the first column <i1> and row <r1> location by utilizing the information present on the signals "Previous Latched Data" and "Previous Latched Mask" referred to earlier. The Previous Write flag is set at the end of the second (write) cycle.

Figure 1:
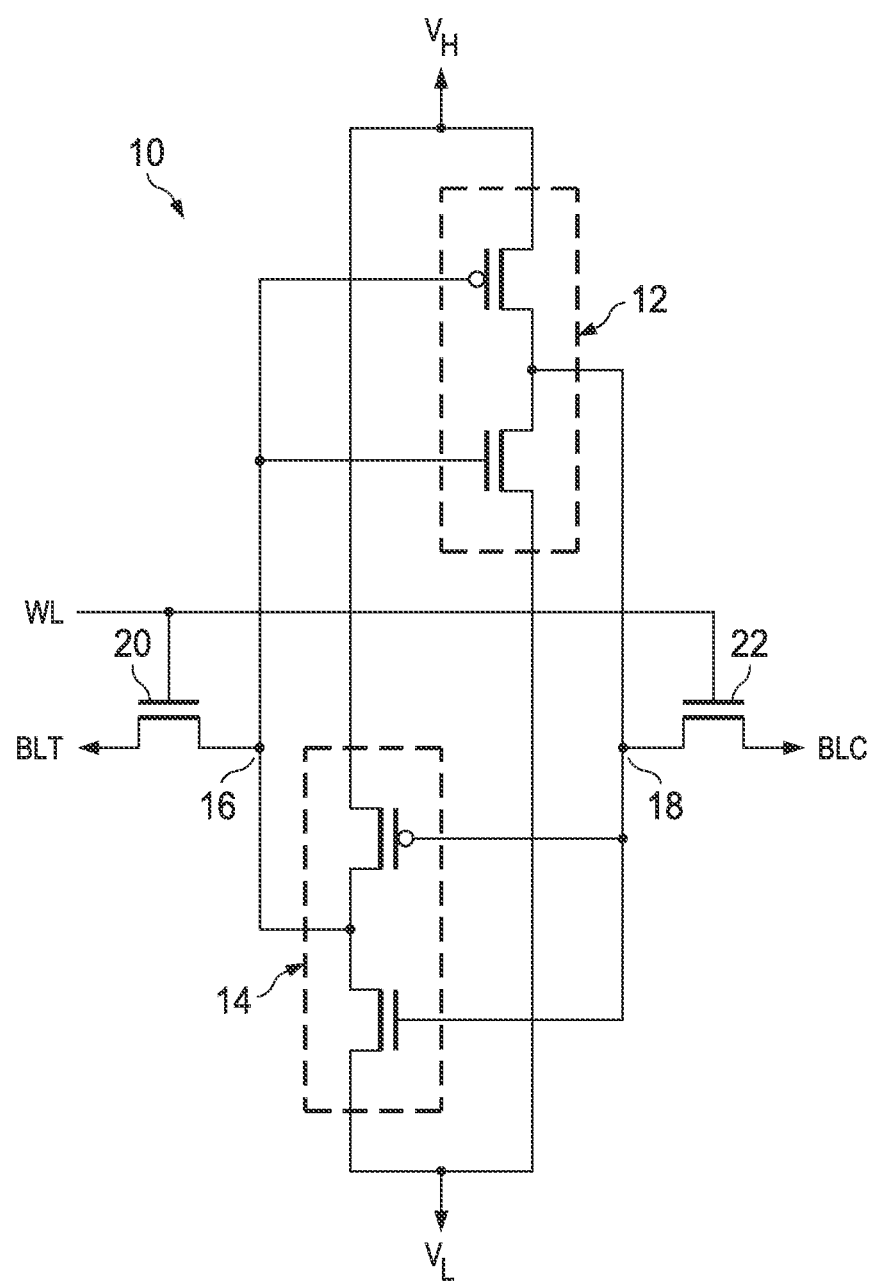
FIG. 1 is a schematic diagram of a standard six transistor static random access memory (SRAM) cell.
Figure 2:
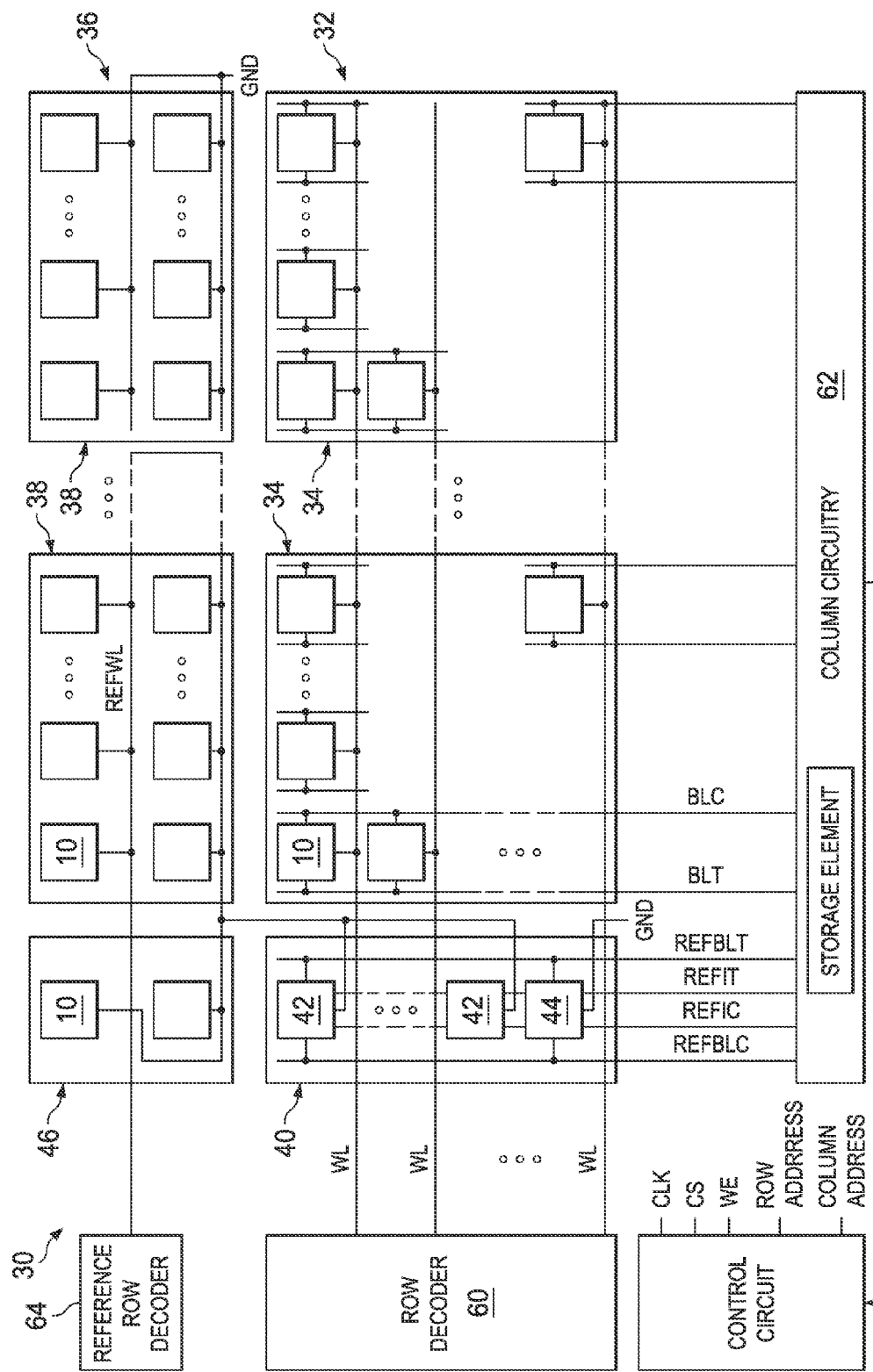
FIG. 2 shows a block diagram of a self-timed memory.

With reference to FIG. 2, the control circuitry for the memory must be modified to perform in accordance with the process described above in each of the recited cases. More specifically, the control circuitry must be able to account for the modified operations associated with CASES 3, 5, 7 and 9 as described above.

FIGS. 5-9 illustrate block diagrams of control circuits used within the control circuitry of a memory such as that shown in FIG. 2 in order to implement the process in accordance with CASES 3, 5, 7 and 9 as described above.

Figure 5:
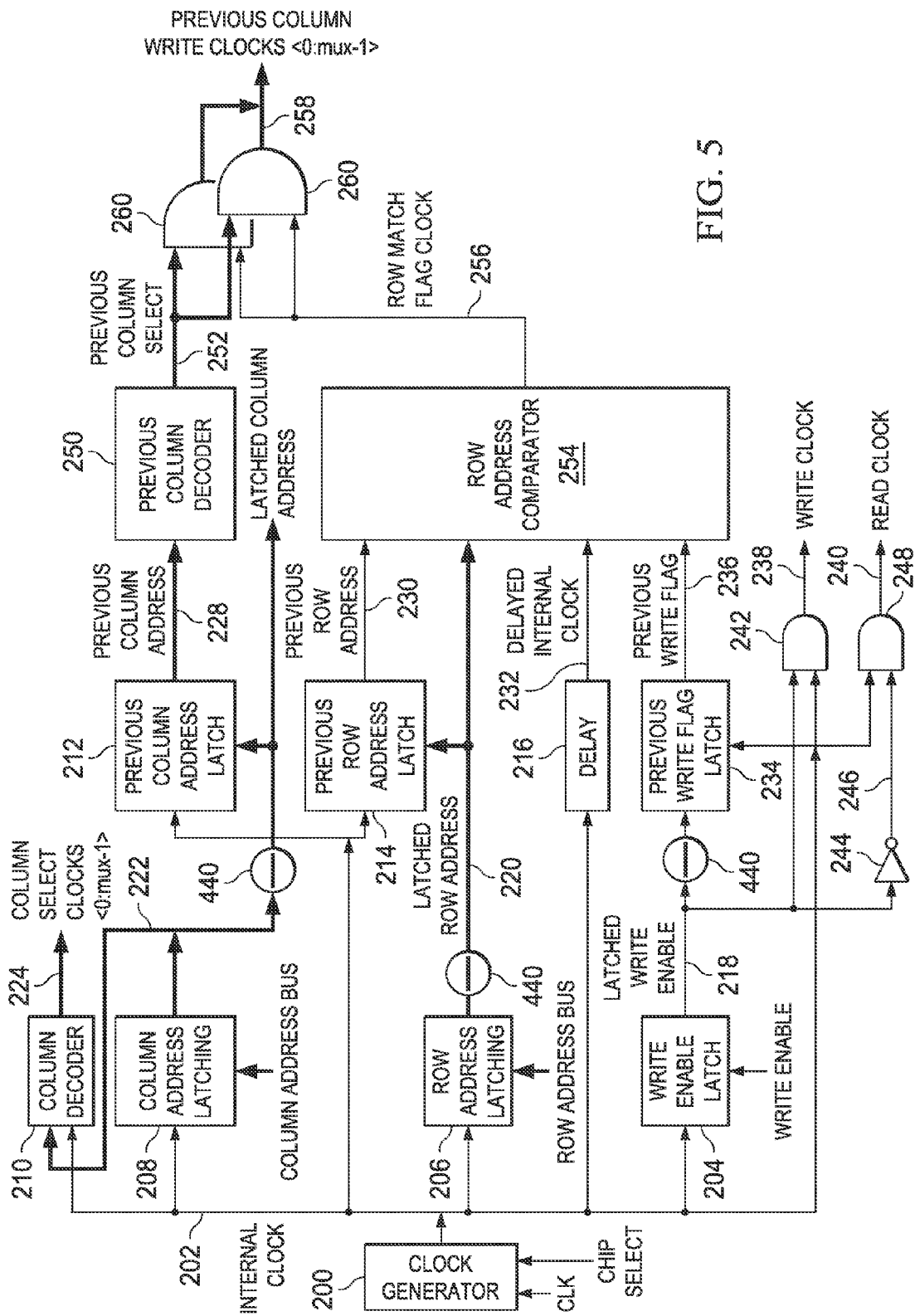

With specific reference to FIG. 5, the control circuitry for the memory (like that shown in FIG. 2) includes a clock generator 200 which receives a reference clock (CLK) and a chip select signal. Responsive thereto, the clock generator 200 produces an internal clock 202. The internal clock 202 is applied to a write enable latch 204, a row address latching circuit 206, a column address latching circuit 208, a column decoder 210, a previous column address latch 212, a previous row address latch 214 and a delay 216.

The write enable latch 204 also receives a write enable control signal and in response to the write enable control signal and internal clock generates a latched write enable control signal 218.

The row address latching circuit 206 also receives the row address for the memory access from the row address bus and in response to the row address and the internal clock generates a latched row address 220.

The column address latching circuit 208 also receives the column address for the memory access from the column address bus and in response to the column address and the internal clock generates a latched column address 222.

The column decoder 210 also receives the latched column address 222 from the column address latching circuit 208 and in response to the latched column address and internal clock generates the column select clocks <0:mux-1> 224 for each of the columns from 0 to "mux-1" respectively.

The previous column address latch 212 also receives the latched column address 222 from the column address latching circuit 208 through a slave latch element 440 (FIG. 8) and in response to the latched column address and the internal clock generates a previous column address signal 228. The previous column address latch 212 functions as a latch for a one cycle delayed value with respect to the latched column address so that both the current latched column address 222 and previous column address 228 are simultaneously available in the same clock cycle.

The previous row address latch 214 also receives the latched row address 220 from the row address latching circuit 208 through a slave latch element 44 (FIG. 8) and in response to the latched row address and internal clock generates a previous row address signal 230. The previous row address latch 214 functions as a latch for a one cycle delayed value with respect to the latched row address so that both the current latched row address 220 and previous row address 230 are simultaneously available in a common clock cycle.

The delay 216 functions to delay the internal clock 202 and generate a delayed internal clock 232.

The control circuitry further includes a previous write flag latch 234 which receives the latched write enable signal 218 and the internal clock. Responsive thereto, the previous write flag latch 234 generates a previous write flag signal 236 which is active in response to the end of any write cycle and is cleared following completion of a read cycle.

The control circuitry still further includes logic circuits configured to generate a write clock 238 and a read clock 240. The logic circuits comprise a first logic AND gate 242 which logically ANDs the latched write enable signal 218 and the internal clock 202 to generate the write clock 238. The logic circuits further comprise a NOT gate 244 configured to generate an inverted latched write enable signal 246. The logic circuits also comprise a second logic AND gate 248 which logically ANDs the inverted latched write enable signal 246 and the internal clock 202 to generate the read clock 240.

The control circuitry also includes a previous column decoder 250 which functions to decode the previous column address 228 and generate previous column select signals 252 for each column of the memory.

The control circuitry further includes a row address comparator 254 that receives the current latched row address 220, the previous row address 230, the delayed internal clock 232 and the previous write flag signal 236. The row address comparator 254 generates a row match flag clock signal 256 which is set if the current latched row address 220 matches the previous row address 230 and the previous write flag signal 236 has been set.

The control circuitry additionally includes logic circuits configured to generate previous column write clocks <0:mux-1> 258. The logic circuits include a logical AND gate 260 for each column which logically ANDs the previous column select signal 252 for that column with the row match flag clock signal 256. The previous column write clock for the column which was accessed in the previous write cycle is accordingly set when the previous and current row addresses are the same.

As can be observed, in any cycle following a write operation and accessing (either reading or writing) the same row address as the previous write operation, the "previous column write clock" corresponding to the column which was accessed in the previous write cycle gets generated. The generated "previous column write clock" is used in each bit (i.e. IO) of the memory along with the "previous latched data" and "previous latched mask" in any bit to perform a repeat write of data written into the memory cells in previous write cycle into the same memory cells for the cases 3, 5, 7 and 9 described above. This repeat write of previously written data is in addition to the operation being performed in the current cycle.

Figure 6B:
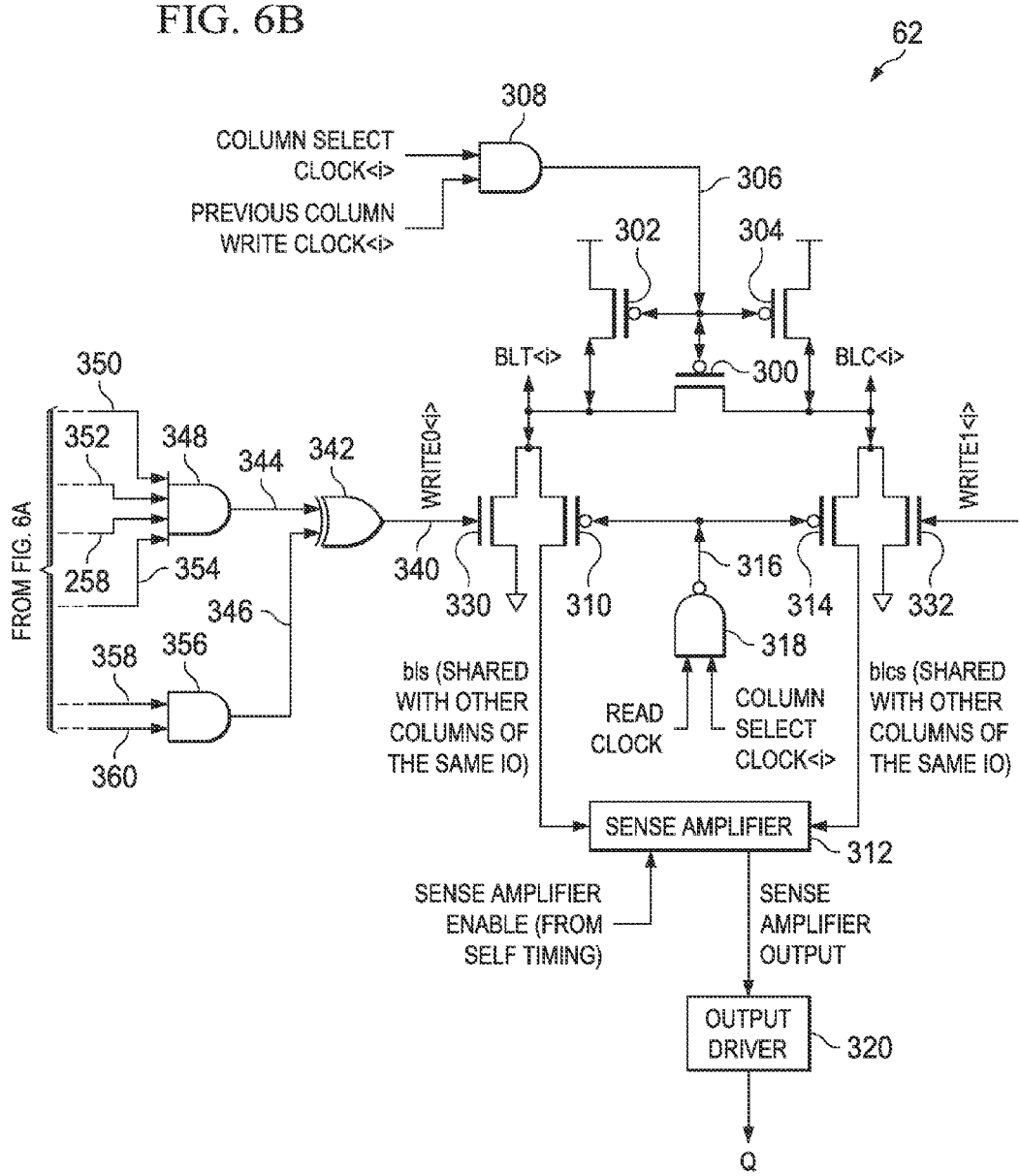

Reference is now made to FIGS. 6A and 6B. The column circuitry 62 (see, also, FIG. 2) is repeated for each bit (i.e., IO)

of the memory and is coupled to the true bitline (BLT) and complement bitline (BLC) for respective bits. A transistor 300 used as an equalizer is source-drain connected between the true bitline (BLT) and complement bitline (BLC). A transistor 302 is source-drain connected between a reference supply voltage and the true bitline (BLT). A transistor 304 is source-drain connected between the reference supply voltage and the complement bitline (BLC). These transistors 302 and 304 are used to precharge BLT and BLC to the reference supply voltage level before the start of any memory operation. The control terminals (gates) of the transistors 300, 302 and 304 are connected to each other and to receive a control signal 306 generated by a logic circuit in the form of a logic AND gate 308. The AND gate 308 logically ANDs the column select clock 224 signal and previous column write clock 258 signal for the corresponding column <i> generated in the control circuitry described above (see, FIG. 5). When either or both of the column select clock 224 signal and previous column write clock 258 signal are logic low, the transistors 300, 302 and 304 are turned on and the reference supply voltage is applied to both the true bitline (BLT) and complement bitline (BLC) and the voltages on true bitline (BLT) and complement bitline (BLC) are equalized. Thus the precharge and equalization devices for any column in each bit are turned off either when the current operation is addressing that column or when the previous cycle was a write operation on that column and the current operation is targeting the same row as the previous write cycle.

A transistor 310 is source-drain connected between the true bitline (BLT) and a first differential input of a sense amplifier 312. A transistor 314 is source-drain connected between the complement bitline (BLC) and a second differential input of the sense amplifier 312. The control terminals (gates) of the transistors 310 and 314 are connected to each other and to receive a control signal 316 generated by a logic circuit in the form of a logic NAND gate 318. The NAND gate 318 logically NANDs the read clock 240 signal and the column select clock 224 signal for the corresponding column <i> generated in the control circuitry described above (see, FIG. 5). When both the read clock 240 signal and the column select clock 224 signal are logic high, the transistors 310 and 314 are turned on and the true bitline (BLT) and complement bitline (BLC) are connected to the differential inputs of the sense amplifier 312. The sense amplifier 312 operation is enabled by a sense amplifier enable signal and the sense amplifier output is provided to an output driver circuit 320 which generates the data output Q.

The column circuitry of the memory further includes a transistor 330 that is source-drain connected between the true bitline (BLT) and a reference supply node (for example, ground). A transistor 332 is source-drain connected between the complement bitline (BLC) and the reference supply node (for example, ground).

The control terminal (gate) of transistor 330 receives a write 0 control signal 340 generated by a logic circuit in the form of a logic OR gate 342. The logic OR gate 342 receives and logically combines a control signal 344 and control signal 346. The control signal 344 is generated by a logic circuit in the form of a logic AND gate 348. The logic AND gate 348 receives and logically combines a previous latched data bar signal 350, a previous latched mask bar signal 352, the previous column write clock 258 (for the corresponding column) and a no new write signal 354 (for the corresponding column). The control signal 346 is generated by a logic circuit in the form of a logic AND gate 356. The logic AND gate 356 receives and logically combines a new write signal 358 (for the corresponding column) and a latched data bar signal 360. The no new write signal 354 is generated by inverting (reference 362) the new write signal 358.

The control terminal (gate) of transistor 332 receives a write 1 control signal 370 generated by a logic circuit in the form of a logic OR gate 372. The logic OR gate 372 receives and logically combines a control signal 374 and control signal 376. The control signal 374 is generated by a logic circuit in the form of a logic AND gate 378. The logic AND gate 378 receives and logically combines a previous latched data signal 380, a previous latched mask bar signal 352, the previous column write clock 258 (for the corresponding column) and the no new write signal 354 (for the corresponding column). The control signal 376 is generated by a logic circuit in the form of a logic AND gate 386. The logic AND gate 386 receives and logically combines the new write signal 358 (for the corresponding column) and the latched data signal 390. The latched data bar signal 360 is generated by inverting (reference 392) the latched data signal 390.

Thus the write 0 driver device (transistor 330) for any column in each bit is turned on either when the current operation is a write 0 on that column or when the previous cycle was a write 0 operation on that column, the current operation is targeting the same row as the previous write cycle and is either any operation (read or write) on a column other than that column or is a read or masked write operation on that column. Similarly, Thus the write 1 driver device (transistor 332) for any column in each bit is turned on either when the current operation is a write 1 on that column or when the previous cycle was a write 1 operation on that column, the current operation is targeting the same row as the previous write cycle and is either any operation (read or write) on a column other than that column or is a read or masked write operation on that column.

The column circuitry further includes a data latch 400 and a mask latch 402. The data latch 400 receives the input data and the write clock 238 and generates in response thereto the latched data signal 390. The mask latch 402 receives the input mask and the write clock 238 and generates in response thereto a latched mask signal 404. An inverter 406 generates a latched mask bar signal 408 by inverting the latched mask signal 404.

The column circuitry still further includes a previous data latch 410 and a previous mask latch 412. The previous data latch 410 latches the signal received by passing the latched data signal 390 through a slave latch element 440 (FIG. 8) and outputs a previous latched data signal 380. An inverter 416 generates the previous latched data bar signal 350 from the previous latched data signal 380. The mask latch 412 latches the signal received by passing the latched mask bar signal 408 through a slave latch element 440 (FIG. 8) and outputs a previous latched mask signal 414. An inverter 418 generates the previous latched mask bar signal 352 from the previous latched mask signal 414.

The column circuitry also includes logic circuitry associated with generating the new write signal 358 for each column. A logic circuit in the form of a logic AND gate 420 receives the write clock 238 and column select clock 224 (for the corresponding column) and generates a new write clock signal 422 (for the corresponding column). A logic circuit in the form of a logic AND gate 424 receives the new write clock signal 422 and the latched mask bar signal 408 to generate the new write signal 358.

As can be observed, in any cycle following a write 0 operation on any column of a bit and accessing (either reading or writing) the same row address as the previous write operation, a logic 0 is driven onto bitline BLT of that column if either the current operation is a write 0 on that column or when the current operation is targeting the same row as the previous write cycle and is either any operation (read or write) on a column other than that column or is a read or masked write operation on that column. Similarly, in any cycle following a write 1 operation on any column of a bit and accessing (either reading or writing) the same row address as the previous write operation, a logic 0 is driven onto bitline BLC of that column if either the current operation is a write 1 on that column or when the current operation is targeting the same row as the previous write cycle and is either any operation (read or write) on a column other than that column or is a read or masked write operation on that column.

Figure 7:
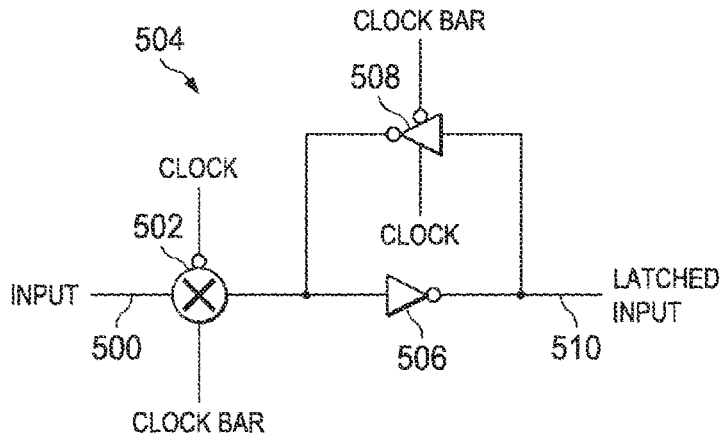

Reference is now made to FIG. 7 which illustrates an exemplary implementation for a latch circuit as used in FIGS. 5 and 6. The latch circuit includes an input 500 coupled to a pass gate 502 controlled by clock and clock bar signals. The output of the pass gate 502 is connected to a static latch 504 formed by a first inverter 506 having an input connected to the output of the pass gate 502 and an output connected to the output 510 of the latch circuit. The static latch further includes a second inverter 508 having an input connected to the output 510 of the latch circuit and an output connected to the input of the first inverter 506. The second inverter 508 is driven in response to the clock and clock bar signals.

Figure 8:
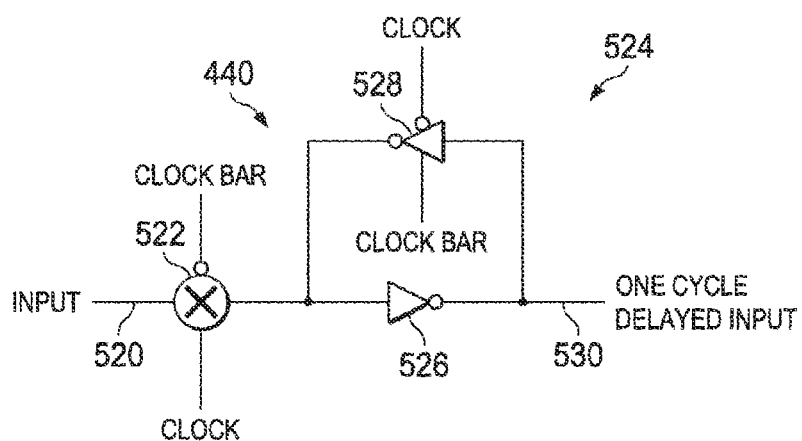

Reference is now made to FIG. 8 which illustrates an exemplary implementation for a slave latch circuit 440. The delay circuit includes an input 520 coupled to a pass gate 522 controlled by clock and clock bar signals. The output of the pass gate 522 is connected to a static latch 524 formed by a first inverter 526 having an input connected to the output of the pass gate 522 and an output connected to the output 530 of the delay circuit. The static latch further includes a second inverter 528 having an input connected to the output 530 of the delay circuit and an output connected to the input of the first inverter 526. The second inverter 528 is driven in response to the clock and clock bar signals.

The slave latch circuit 440 of FIG. 8 is advantageously used in the control circuitry of FIGS. 5 and 6 to provide a controlled delay in the propagation of signals and data. With reference to FIG. 5, the slave latch circuit is provided with respect to: the current latched column address 222 between the output of the column address latching circuit 208 and the previous column address latch 212; the latched write enable signal 218 between the write enable latch 204 and the previous write flag latch 234; and the latched row address 220 between the row address latching circuit 206 and the previous row address latch 214. With reference to FIG. 6, the slave latch circuit is provided with respect to: the latched data signal 390 between the data latch 400 and the previous data latch 410 in each IO; and the latched mask bar signal 408 between the inverter 406 and the previous masked latch 412.

Figure 9:
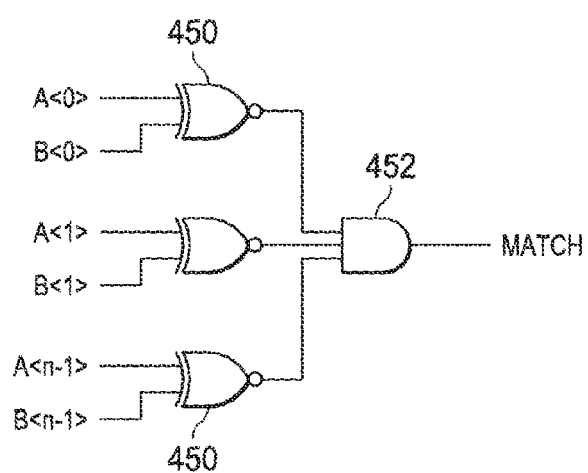

Reference is now made to FIG. 9 which illustrates an exemplary implementation for an n-bit comparator as used in FIG. 5. The comparator functions to compare a first n-bit signal A to a second n-bit signal B. The comparator includes a logic circuit in the form of n logic XOR gates 450, each XOR gate 450 receiving one bit of each signal to be compared. The outputs of the gates 450 are applied to the inputs of a logic AND gate 452, with the output of the gate 452 providing the logical result of the multi-bit comparison of the signals A and B. With reference to FIG. 5, the comparator may be used in the row address comparator 254.

Figure 10:
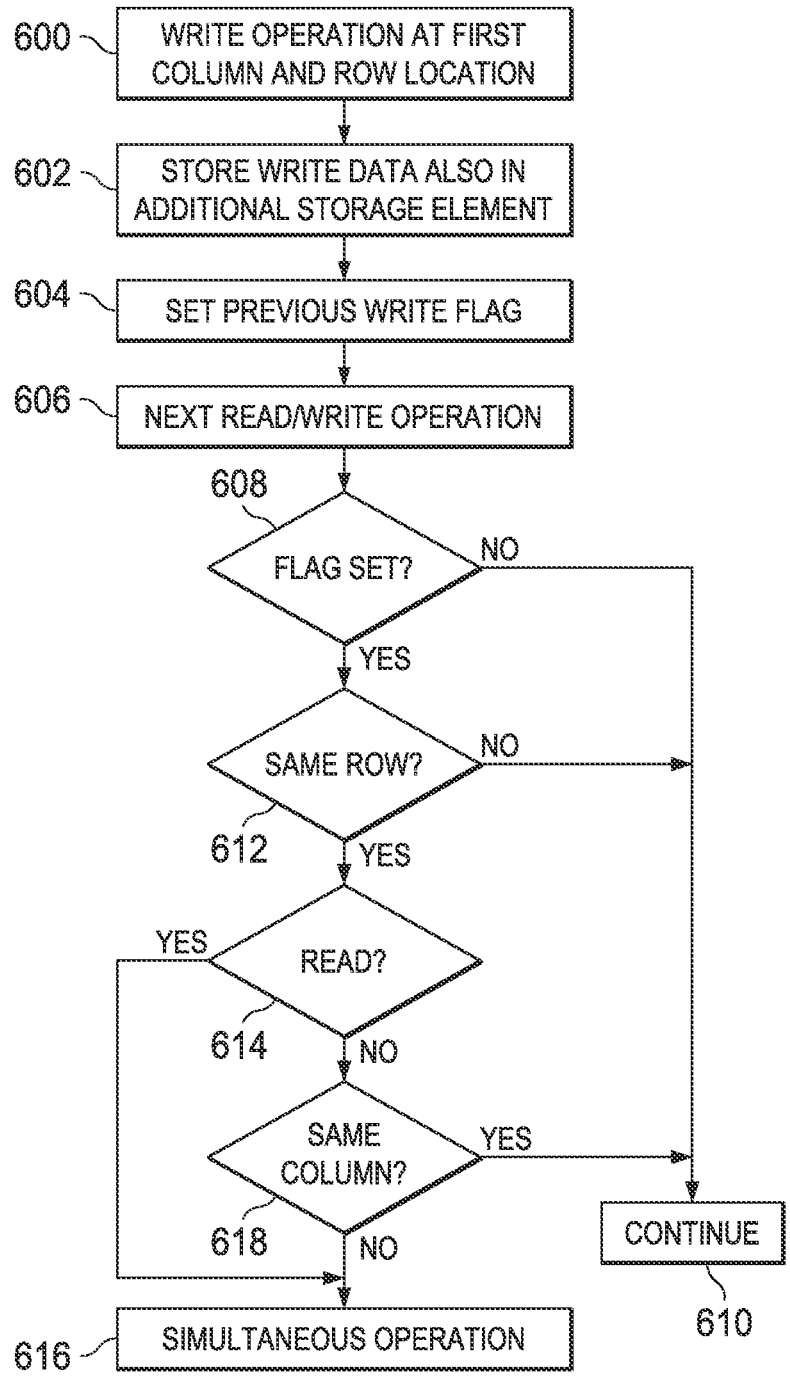
FIG. 10 is a flow diagram for memory operation.

Reference is now made to FIG. 10 which illustrates a flow diagram for basic operation of the memory in accordance with the improved process of CASES 3, 5, 7 and 9 described above.

In step 600, associated with a first cycle, a write operation (such as a data write or a masked data write) performed on a cell of the memory at a first column <i1> and row <r1> location.

In step 602, the data being stored by the first cycle write operation at the memory cell at a first column <i1> and row <r1> location is also stored at an additional storage element (for example, in the slave latch 440).

In step 604, the Previous Write flag is set at the end of the first (write) cycle.

The steps 600, 602 and 604 all occur in the context of the first write cycle time.

In step 606, associated with a second (next) cycle, a read or write operation is performed.

In step 608, a test is made as to whether the Previous Write flag is set. If no, the previous operation was a read, not a write, and the memory operation continues in step 610 in accordance with prior art techniques. This would effectuate the process in accordance with CASE 2 described above.

If the Previous Write flag was set, and thus the first cycle was a write cycle of some type, a test is made as to whether the second (next) cycle read or write operation is made on the same row as the first write operation of step 600. If no, the memory operation continues in step 610 in accordance with prior art techniques. This would effectuate the process in accordance with CASE 1 described above.

If yes, a test is made in step 614 as to whether second (next) cycle operation is a read. If yes, the memory operation performs a simultaneous action in step 616 during the second (next) cycle to read from the memory cell addressed by the second (next) cycle and write back the data stored in step 602 to the memory cell addressed by the first cycle. This would effectuate the processes in accordance with CASES 3 and 5 described above.

If no, a test is made in step 618 as to whether the second (next) cycle write operation is made on the same column as the first write operation of step 600. If yes, the memory operation continues in step 610 in accordance with prior art techniques. This would effectuate the process in accordance with CASE 8 described above.

If no, the memory operation performs a simultaneous action in step 616 during the second (next) cycle to read from or perform a masked write to the memory cell addressed by the second (next) cycle and write back the data stored in step 602 to the memory cell addressed by the first cycle. This would effectuate the process in accordance with CASE 7 and CASE 9 described above.

To address the situation of CASES 4 and 6 described above, the test in step 608 for whether the flag was set may be further refined to include a test for whether the write operation in the first cycle was a masked write. If so, the memory operation would continue in step 610 in accordance with prior art techniques.

With respect to the simultaneous action of step 616:

for CASE 3, a parallel read and write operation is performed during the second (next) cycle wherein: a) data is read from the cell at the second column <i2> and the first row <r1> location, and simultaneously b) the previously written data from the first cycle is written back into (i.e., written again) the cell at first column <i1> and row <r1> location by utilizing the information present on the signals "Previous Latched Data" and "Previous Latched Mask" referred to earlier;

for CASE 5, a parallel read and write operation is performed during the second (next) cycle wherein: a) data is read from the memory cell at the first column <i1> and row <r1> location, and simultaneously b) the previously written data is written back into (i.e., written again) the cell at the first column <i1> and row <r1> location by utilizing the information present on the signals "Previous Latched Data" and "Previous Latched Mask" referred to earlier;

for CASE 7, a parallel write operation is performed during the second cycle wherein: a) data is written into the cell at the second column <i2> and the first row <r1> location and simultaneously b) the previously written data is written back into (i.e., written again) the cell at the first column <i1> and row <r1> location by utilizing the information present on the signals "Previous Latched Data" and "Previous Latched Mask" referred to earlier; and for CASE 9, only a write operation is performed during the second cycle wherein: the previously written data is written back into (i.e., written again) the cell at the first column <i1> and row <r1> location by utilizing the information present on the signals "Previous Latched Data" and "Previous Latched Mask" referred to earlier.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A method, comprising:
    performing a write operation to a first cell of a memory array at a first row and first column location during a first memory access cycle; and
    performing a memory access operation to a second cell of the memory array at a second row and second column location during a second memory access cycle, said second memory access cycle immediately following the first memory access cycle, wherein performing comprises:
        determining if the second row is a same row as the first row;
        determining if the second column is a different column than the first column; and
        if the second row is the same row as the first row and the memory access operation is a read, or if the second row is the same row as the first row, the second column is the different column than the first column and the memory access operation is a write, then:
    simultaneously within said second memory access cycle accessing the second cell and re-writing data from the first memory access cycle write operation to the first cell.

2. The method of claim 1, wherein performing the write operation to the first cell further comprises storing the data from the first memory access cycle write operation in a storage element distinct from the first cell of the memory array.

3. The method of claim 2, wherein re-writing data from the first memory access cycle write operation to the first cell comprises writing the data in the storage element to the first cell.

4. The method of claim 1, wherein accessing the second cell comprises reading data from the second cell during the second memory access cycle.

5. The method of claim 1, wherein accessing the second cell comprises writing data to the second cell during the second memory access cycle.

6. The method of claim 1, wherein performing further comprises if the second row is the same row as the first row, the second column is not different from the first column and the memory access operation is a read, then: simultaneously within said second memory access cycle performing the read and re-writing data from the first memory access cycle write operation to the first cell.

7. A method, comprising:
    performing a first write operation to a first cell of a memory array at a first row and first column location during a first memory access cycle; and
    performing a second write operation to a second cell of the memory array at a second row and second column location during a second memory access cycle, said second memory access cycle immediately following the first memory access cycle, wherein performing comprises:
        determining if the second row is a same row as the first row;
        determining if the second column is a different column than the first column; and
        if both determinations are positive, then: simultaneously within said second memory access cycle writing to the second cell and re-writing data from the first memory access cycle first write operation to the first cell.

8. The method of claim 7, wherein performing the write operation to the first cell further comprises storing the data from the first memory access cycle first write operation in a storage element distinct from the first cell of the memory array.

9. The method of claim 8, wherein re-writing data from the first memory access cycle first write operation to the first cell comprises writing the data in the storage element to the first cell.

10. A method, comprising:
    performing a write operation to a first cell of a memory array at a first row and first column location during a first memory access cycle; and
    performing a read operation from a second cell of the memory array at a second row and second column location during a second memory access cycle, said second memory access cycle immediately following the first memory access cycle, wherein performing comprises:
        determining if the second row is a same row as the first row; and
        if said determination is positive, then: simultaneously within said second memory access cycle reading from the second cell and re-writing data from the first memory access cycle write operation to the first cell.

11. The method of claim 10, wherein performing the write operation to the first cell further comprises storing the data from the first memory access cycle write operation in a storage element distinct from the first cell of the memory array.

12. The method of claim 11, wherein re-writing data from the first memory access cycle write operation to the first cell comprises writing the data in the storage element to the first cell.

13. The method of claim 10, wherein performing further comprises:
    determining if the second column is a different column than the first column; and
    if the second row is the same row as the first row and the second column is not different from the first column, then: simultaneously within said second memory access cycle performing the read and re-writing data from the first memory access cycle write operation to the first cell.

14. A circuit, comprising:
    a memory array including a plurality of memory cells arranged in rows and columns;

a control circuit configured to control read and write access to the memory array, said control circuit operable to:

determine whether a write operation during a first memory access cycle to a first cell and a memory access operation during a second memory access cycle to a second cell share access to a same row and different column of the memory array, said second memory access cycle immediately following the first memory access cycle; and if there is a same row and the memory access operation is a read, or if there is a same row and different column and the memory access operation is a write, then: simultaneously within said second memory access cycle access the second cell and re-write data from the first memory access cycle write operation to the first cell.

15. The circuit of claim 14, further comprising a storage element distinct from the first cell of the memory array, said control circuit further operable, when performing the write operation to the first cell, to further store the data from the first memory access cycle write operation in said storage element.

16. The circuit of claim 15, wherein said control circuit is further operable in the re-write of data from the first memory access cycle write operation to the first cell to write data from the storage element to the first cell.

17. The circuit of claim 14, wherein said memory access operation is a read of data from the second cell during the second memory access cycle.

18. The circuit of claim 14, wherein said memory access operation is a write of data to the second cell during the second memory access cycle.

19. The circuit of claim 14, wherein said control circuit is further operable if the second row is the same row as the first row, the second column is not different from the first column and the memory access operation is a read, to simultaneously within said second memory access cycle perform the read and re-write data from the first memory access cycle write operation to the first cell.

20. A circuit, comprising:
a memory array including a plurality of memory cells arranged in rows and columns; and
a control circuit configured to control read and write access to the memory array, said control circuit operable to:
determine whether a first write operation during a first memory access cycle to a first cell and a second write operation during a second memory access cycle to a second cell share access to a same row and different column of the memory array, said second memory access cycle immediately following the first memory access cycle; and if there is a same row and different column, then: simultaneously within said second memory access cycle perform the write access operation on the second cell and perform a re-write of the data from the first memory access cycle write operation to the first cell.

21. The circuit of claim 20, further comprising a storage element distinct from the first cell of the memory array, said control circuit further operable, when performing the write operation to the first cell, to further store the data from the first memory access cycle first write operation in said storage element, and further in the re-write of data from the first memory access cycle write operation to the first cell to write data from the storage element to the first cell.

22. A circuit, comprising:
a memory array including a plurality of memory cells arranged in rows and columns; and
a control circuit configured to control read and write access to the memory array, said control circuit operable to:
determine whether a write operation during a first memory access cycle to a first cell and a read access operation during a second memory access cycle to a second cell share access to a same row of the memory array, said second memory access cycle immediately following the first memory access cycle; and
if there is a same row access operation is a read, then: simultaneously within said second memory access cycle perform the read access operation on the second cell and perform a re-write of the data from the first memory access cycle write operation to the first cell.

23. The circuit of claim 22, further comprising a storage element distinct from the first cell of the memory array, said control circuit further operable, when performing the write operation to the first cell, to further store the data from the first memory access cycle write operation in said storage element, and further in the re-write of data from the first memory access cycle write operation to the first cell to write data from the storage element to the first cell.

24. The circuit of claim 22, wherein said control circuit is further operable to:
determine whether the write operation and read access operation share access to a same column of the memory array if the second row is the same row as the first row and the second column is not different from the first column, to simultaneously within said second memory access cycle perform the read and re-write data from the first memory access cycle write operation to the first cell.

* * * * *